United States Patent
Swaim

(10) Patent No.: US 10,928,421 B2
(45) Date of Patent: *Feb. 23, 2021

(54) DIFFERENTIAL CONTACT PROBE INCLUDING GROUND MECHANISM AND ASSOCIATED METHODS

(71) Applicant: Keysight Technologies, Inc., Santa Rosa, CA (US)

(72) Inventor: Jason Swaim, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/546,349

(22) Filed: Aug. 21, 2019

(65) Prior Publication Data

US 2019/0377001 A1 Dec. 12, 2019

Related U.S. Application Data

(63) Continuation of application No. 14/611,663, filed on Feb. 2, 2015, now Pat. No. 10,502,762.

(51) Int. Cl.
*G01R 1/067* (2006.01)
*G01R 3/00* (2006.01)
*G01R 19/10* (2006.01)

(52) U.S. Cl.
CPC .......... *G01R 1/06788* (2013.01); *G01R 3/00* (2013.01); *G01R 19/10* (2013.01)

(58) Field of Classification Search
CPC ............ G01R 1/16766; G01R 1/16772; G01R 1/16788; G01R 3/00; G01R 19/10
See application file for complete search history.

(56) References Cited

U.S. PATENT DOCUMENTS

| | | |
|---|---|---|
| 4,791,940 A | 12/1988 | Hirschfeld et al. |
| 5,167,544 A | 12/1992 | Brinkman et al. |
| 5,904,581 A | 5/1999 | Pope et al. |
| 6,276,956 B1 | 8/2001 | Cook |
| 6,967,473 B1 | 11/2005 | Reed et al. |
| 7,148,712 B1 | 12/2006 | Prey, Jr. et al. |

(Continued)

OTHER PUBLICATIONS

Agilent Technologies, "Agilent 1168/9A Differential and Single-Ended Probes", User's Guide, Apr. 2014.

(Continued)

*Primary Examiner* — Huy Q Phan
*Assistant Examiner* — Dustin R Dickinson

(57) ABSTRACT

A handheld differential contact probe includes a housing configured to be held in a hand of a user, a pair of probe arms carried by the housing, and a pair of opposing probe tip assemblies each carried by one of the respective probe arms and each having a probe tip circuit coupled to a probe tip at a distal end thereof. A probe tip span adjustment mechanism is carried by the housing and coupled to the pair of probe arms, and configured to adjust a span between the probe tips. A ground path mechanism is coupled between the probe tip circuits of the respective probe tip assemblies, and includes a pair of curved conductive ribbon springs each coupled at an outer end thereof to a respective probe tip circuit, and each curved conductive ribbon spring slidably engaging each other at a respective inner end thereof.

14 Claims, 3 Drawing Sheets

(56) References Cited

U.S. PATENT DOCUMENTS

| | | |
|---|---|---|
| 7,262,614 B1 | 8/2007 | Campbell |
| 7,592,822 B2 | 9/2009 | Reed et al. |
| 9,140,724 B1 | 9/2015 | Campbell |
| 2004/0016742 A1 | 1/2004 | Miyazaki |
| 2006/0148308 A1* | 7/2006 | Pabst .................... H01R 12/78 439/495 |
| 2006/0208751 A1* | 9/2006 | Chen .................. G01R 1/06733 324/755.05 |
| 2006/0267605 A1 | 11/2006 | Yang et al. |
| 2007/0229099 A1* | 10/2007 | Campbell .......... G01R 1/06788 324/755.01 |
| 2016/0216320 A1* | 7/2016 | McTigue ........... G01R 1/06705 |

OTHER PUBLICATIONS

Keysight Technologies, "Keysight InfiniiMax III Series Probes", User's Guide, Apr. 2014.
Tektronix, "TriMode Probe Family P7500 Series Datasheet", Apr. 10, 2013.
Teledyne Lecroy, "WaveLink Series Differential Probe (13-25 GHz)", Operator's Manual, Nov. 2014.
Keysight Technologies, "Keysight N1021B 18 GHz Differential TDR Probe Kit Datasheet", Aug. 3, 2014.
Office Action dated May 20, 2016 in Chinese Application No. 201620099729.3.

* cited by examiner

DIFFERENTIAL CONTACT PROBE INCLUDING GROUND MECHANISM AND ASSOCIATED METHODS

CROSS REFERENCE TO RELATED APPLICATIONS

This application is a continuation under 37 C.F.R. § 1.53(b)(1) of commonly owned U.S. patent application Ser. No. 14/611,663 (now allowed), filed Feb. 2, 2015, which names Jason Swaim as an inventor. The present application claims priority under 35 U.S.C. § 120 to U.S. patent application Ser. No. 14/611,663, the disclosure of which is hereby specifically incorporated by reference in its entirety.

BACKGROUND

Differential voltage contact probes typically transition two uncontrolled transmission lines (i.e. the probe tips) into a more controlled structure such as controlled impedances on a printed circuit board (PCB) or coaxial cables. "Browser" type probes are typically hand-held and therefore have some compliance or "give" to ensure reliable contact and also adjustable span to accommodate probing of different physical geometries. Due to these multiple degrees of freedom a mechanism may be required to maintain the ground of the transmission line at this transition point. An ideal mechanism may have many possible jobs depending on the exact implementation of the probe system including: maintain good electrical contact through full span adjustment; maintain a low inductance ground path (to maximize electrical performance); minimize the loop area of the probe (thus maximizing electrical performance); be robust and not easily damaged by the user; allow for "z-axis" compliance, or compliance normal to the probe tips (and still maintain electrical contact); allow for a very large number of span adjustments; be easy to assemble; and have a low material cost. These probes are typically used with oscilloscopes.

Performing all of these jobs effectively with a single mechanism may be one of the primary challenges in designing and building a browser type probe.

Keysight Technologies Inc. (the present Assignee) currently offers various differential, hand-held browser probes. The N5382A probe has no ground mechanism since the PCB ground provides a low inductance ground connection, and the tip wires transition directly into the PCB with a tip network and then into controlled impedance transmission lines. The span adjustment on this browser probe relies on bending the spring wires. Another Keysight browser probe is the E2675A. This browser probe uses a rotation-based ground mechanism and has a very large loop area. Keysight also sells the N5445A, which is a high-performance browser probe. The ground mechanism on this browser uses two flat, sliding blades each of which is connected to one probe arm while sliding against the other probe arm as the span is adjusted. This results in a good low inductance ground and very small loop area. The blades are designed to be user-replaceable. However, at small span widths, the excess ground blade dangles in space and can affect use of the probe by impairing view of the device under test (DUT).

Lecroy sells a Dxx05 browser probe that uses a flex circuit ground: this ground mechanism has a limited span range and is fully exposed to the customer which makes it easily damaged. The variable ground span relies on the flexing of pc material so the slot between the tips has to be fairly long. This long slot increases the loop area of the tip network and causes excessive inductance. It is also not user-serviceable. Furthermore, since this is a flex circuit there is no variety of metal materials to choose from (e.g. only copper).

Tektronix's probe uses a wire loop for the ground mechanism which may provide good span range, but at small span ranges the bulk of the wire loop is un-utilized and cumbersome. Also, the wire geometry results in poor loop inductance which sacrifices performance. The probe is fully user-exposed and user-serviceable by necessity.

In view of various shortcomings of conventional contact probes, there may be a general need for improved approaches to maintain electrical contact through the entire span range, maintain a low inductance ground path, protect the probe from damage/abuse, allow for a large number of span adjustments/cycles, ease both manufacturing and assembly, reduce cost and/or fit a variety of probe geometries.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
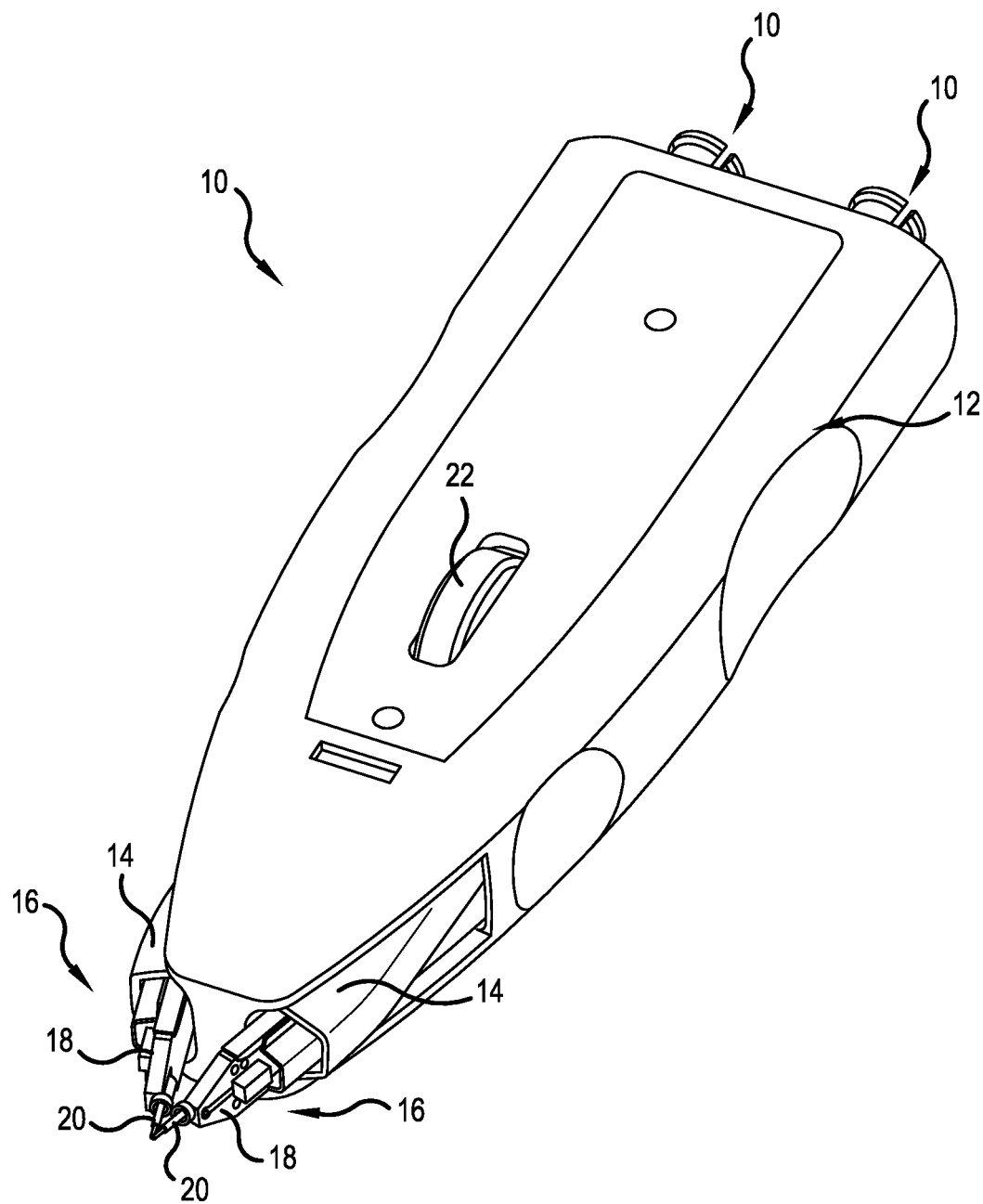
FIG. 1 is a perspective view of an embodiment of a handheld differential contact probe in accordance with features of the present invention.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices. As used in the specification and appended claims, and in addition to their ordinary meanings, the terms 'substantial' or 'substantially' mean to within acceptable limits or degree. As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

Figure 2:
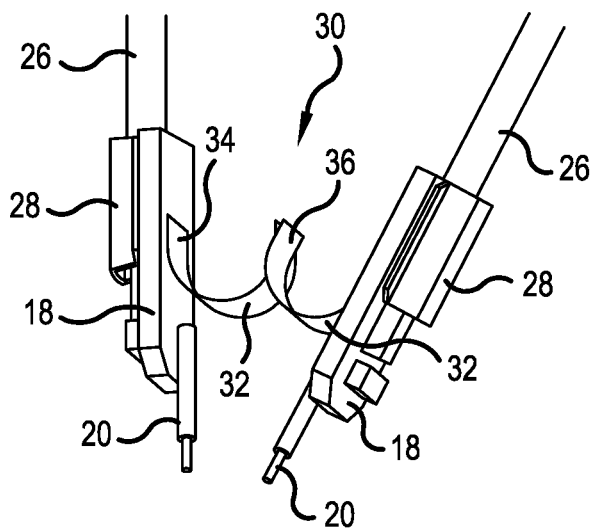
FIG. 2 is a perspective view of an embodiment of the ground path mechanism of the handheld differential contact probe of FIG. 1.

Referring initially to FIGS. 1 and 2, a representative embodiment of a handheld differential contact probe 10 will be described. The handheld differential contact probe 10 includes a housing 12 configured to be held in a hand of a user. The housing 12 may be a shell-type housing that defines an interior space for housing various components therein, for example. The housing 12 may be formed of plastic, for example. A pair of probe arms 14 is carried by the housing 12. Each of a pair of opposing probe tip assemblies 16 is carried by one of the respective probe arms 14. Each probe tip assembly 16 includes a probe tip circuit 18, such as a printed circuit board (PCB), coupled to a probe tip 20 at a distal end thereof. The probe tip 20 of each probe tip assembly 16 may be a pogo pin, for example, to provide compliance in the z-axis, i.e. away from the device under test (DUT).

A probe tip span adjustment mechanism 22 is carried by the housing 12 and coupled to the pair of probe arms 14. The probe tip span adjustment mechanism 22 is configured to adjust a span between the probe tips 20 as would be appreciated by those skilled in the art. As illustrated, the probe tip span adjustment mechanism 22 may be a thumb wheel (e.g. with a corresponding axes and/or gear mechanism. As illustrated, in an embodiment, a pair of signal connectors 24 (e.g. RF connectors) are carried by the housing 12. Such signal connectors 24 are for connection to an external instrument or device, e.g. such as an oscilloscope. The signal connectors 24 are coupled to respective probe tip circuits 18, for example, via corresponding transmission lines, e.g. coaxial cables 26 and respective coaxial connectors 28.

A ground path mechanism 30 is coupled between the probe tip circuits 18 of the respective probe tip assemblies 16, and includes a pair of curved conductive ribbon springs 32 each coupled at an outer end 34 thereof to a respective probe tip circuit 18, and each curved conductive ribbon spring 32 slidably engaging each other at a respective inner end 36 thereof. As illustrated in FIG. 2, the portion of the curved conductive ribbon springs 32 at the inner end 36, and not being used electrically in the ground path, curls back into the wider area between the upper portions of the opposing probe tip assemblies 16, and so does not interfere with the operation of probe tips 20 while adjacent a DUT.

In an embodiment, the opposing probe tip assemblies 16 are symmetrical, and each of the pair of curved conductive ribbon springs 32 is symmetrical. Each of the curved conductive ribbon springs 32 may include a copper alloy spring metal and gold plating. Each of the curved conductive ribbon springs 32 may include a spring metal with at least one of beryllium copper (BeCu), phosphor bronze and spring steel.

Figure 3:
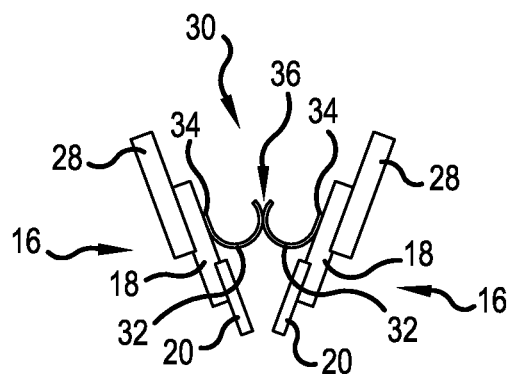
FIG. 3 is a schematic diagram of an embodiment of the ground path mechanism of the handheld differential contact probe of FIG. 1.

FIG. 3 is a schematic side view of an embodiment of the ground path mechanism 30 and probe tip assemblies 16. Each of the curved conductive ribbon springs 32 may be a U-shaped conductive ribbon spring, e.g. as illustrated. Herein, the outer ends 34 are electrically coupled to a respective probe tip circuit 18, for example, via solder or adhesive. The inner end 36 of each curved conductive ribbon spring 32 slides (e.g. frictionally slides and/or rolls) against the inner end 36 of the other curved conductive ribbon spring 32. Each of the curved conductive ribbon springs 32 is configured to elastically deform and maintain electrical contact with each other while the span between the probe tips 20 is adjusted by the probe tip span adjustment mechanism 22.

Figure 4:
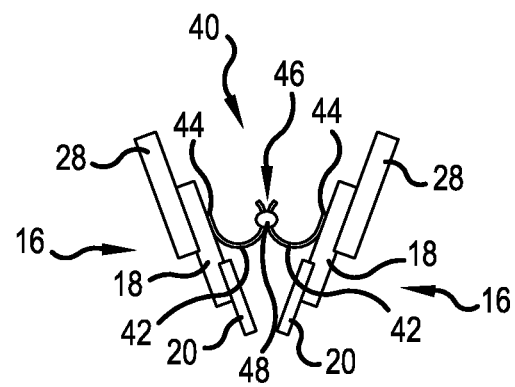
FIG. 4 is a schematic diagram of another embodiment of the ground path mechanism of the handheld differential contact probe of FIG. 1.

FIG. 4 is a schematic side view of another representative embodiment of a ground path mechanism 40 and opposing probe tip assemblies 16, also referred to herein as first and second probe tip assemblies. The ground path mechanism 40 is coupled between the probe tip circuits 18 of the first and second probe tip assemblies 16, and includes at least one curved conductive ribbon spring 42 configured to elastically deform and slidably maintain electrical coupling between the probe tip circuits 18 of the first and second opposing probe tip assemblies while the span between the probe tips 20 is adjusted by the probe tip span adjustment mechanism 22.

As illustrated, the curved conductive ribbon spring 42 is a W-shaped conductive ribbon spring configured to elastically deform and, at outer ends 44 thereof, slidably maintain electrical contact at the probe tip circuits 18 of the first and second opposing probe tip assemblies 16 while the span between the probe tips 20 is adjusted by the probe tip span adjustment mechanism 22. Here, the center 46 of the W-shaped conductive ribbon spring is secured to the housing 12, e.g. via a pin 48.

Alternatively, in other embodiments, the at least one curved conductive ribbon spring 42 may be a U-shaped conductive ribbon spring configured to elastically deform and, at one end thereof, is coupled to a probe tip circuit 18 of one probe tip assembly 16, while at the other end thereof, slidably maintains electrical contact at the probe tip circuit 18 of the other probe tip assembly 16 while the span between the probe tips 20 is adjusted by the probe tip span adjustment mechanism 22.

The various embodiments of ground path mechanisms 30/40, including the various described spring arrangements, may be provided in the handheld differential contact probe 10 of FIG. 1.

The described embodiments may provide various benefits compared to conventional handheld differential contact probes. For example, certain embodiments may provide advantages including maintaining electrical contact through the entire span range, maintaining a low inductance ground path, protecting the probe from damage/abuse, allowing for a large number of span adjustments/cycles, easing both manufacturing and assembly, reducing cost and/or fitting a variety of probe geometries.

Figure 5:
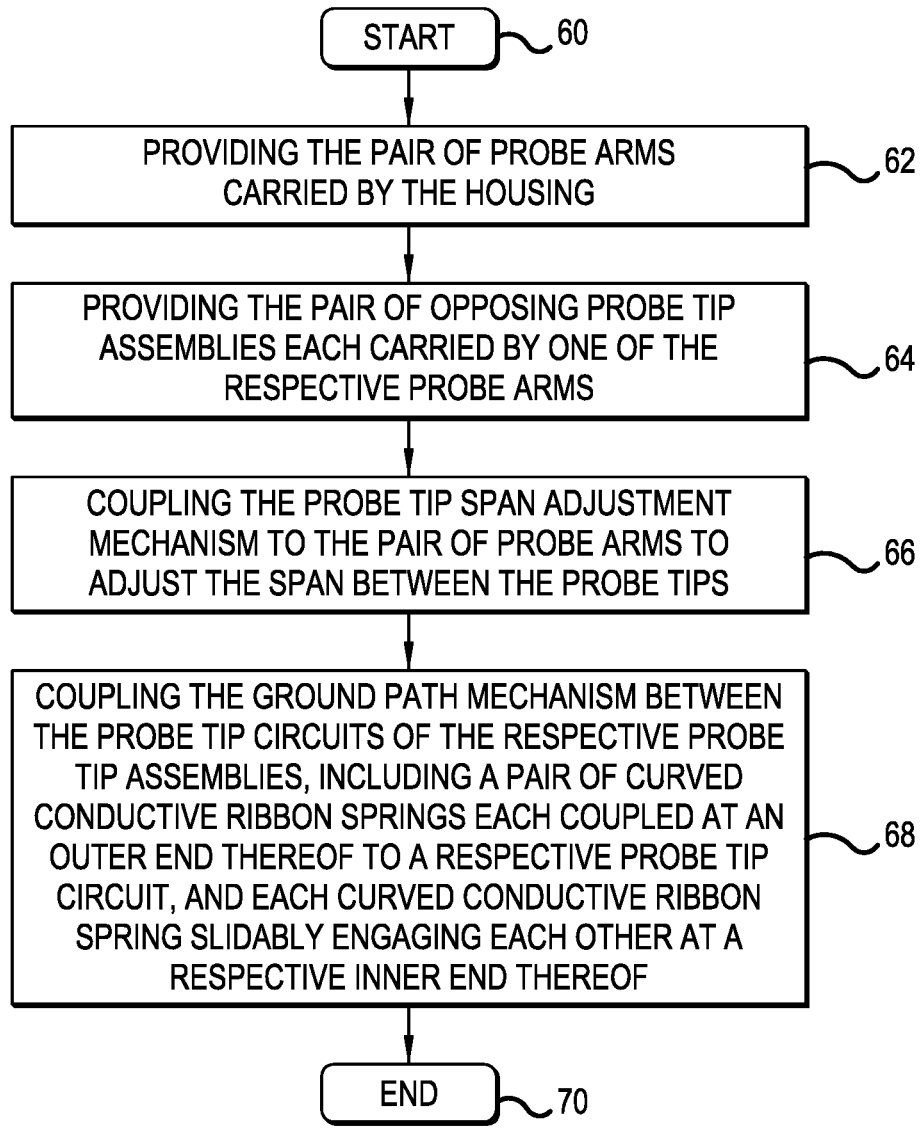
FIG. 5 is a flowchart illustrating a method of making a handheld differential contact probe according to a representative embodiment.

A method aspect of the present embodiments will be described with additional reference to the flowchart of FIG. 5. The method is for manufacturing the handheld differential contact probe 10. The method begins (block 60) and includes providing the pair of probe arms 14 carried by the housing 12 at block 62. The method continues at block 64 including providing the pair of opposing probe tip assemblies 16 each carried by one of the respective probe arms 14 and each comprising a probe tip circuit 18 coupled to a probe tip 20 at a distal end thereof. The method includes coupling (at block 66) the probe tip span adjustment mechanism 22, carried by the housing 12, to the pair of probe arms 14, to adjust the span between the probe tips 20. At block 68 the ground path mechanism 30 is coupled between the probe tip circuits 18 of the respective probe tip assemblies 16, and includes a pair of curved conductive ribbon springs 32 each coupled at an outer end 34 thereof to a respective probe tip circuit 18, and each curved conductive ribbon spring 32 slidably engaging each other at a respective inner end 36 thereof, before the method ends (block 70).

Each of the curved conductive ribbon springs 32 may be configured to elastically deform and maintain electrical contact with each other while the span between the probe tips 20 is adjusted by the probe tip span adjustment mechanism 22. In various embodiments, each of the curved conductive ribbon springs 32 are formed by gold plating a copper alloy spring metal, or each of the curved conductive ribbon springs 32 is formed of a spring metal including at least one of beryllium copper (BeCu), phosphor bronze and spring steel.

This above described embodiments may provide more span range with a smaller ground loop area. From a practical viewpoint, this means it can measure a wider range of DUT geometries and get a higher-fidelity measurement at the same time. It may be a simpler mechanism than conventional devices, which benefits cost, manufacturing, and robustness.

As discussed above, hand-held differential contact probes have a number of challenges. Since these probes experience forces in virtually all directions, tip mechanisms, including a ground mechanism, must accommodate this. Higher performance probes are typically smaller in physical size, due to the physics of microwave electronics. Typically materials that are robust with considerable compliance are not conductive and do not make good springs. The handheld differential contact probes need some way to maintain a mostly controlled impedance as close to the tip as possible, and this region is very "mechanically active" and needs to be physically very small.

In the present embodiments, metal components can be designed as springs and coated with very electrically conductive materials such as gold. In this way electrical contact is maintained and some mechanical compliance is achieved. The present embodiments use ribbon-shaped, spring metal (e.g. BeCu, spring steel, or phosphor bronze) in two shaped segments that slide against each other, or in a single segment that slides against one or both of the probe tip circuits, e.g. against the copper ground plane of a PCB.

The present described embodiments may be referred to as PCB-based browsers with pogo-pin tips. As mentioned above, the two sides of the probe tip assemblies 16 may be identical/symmetrical, which greatly reduces cost.

The present embodiments could also work with probe tips 20 that are adjusted around an axis of rotation. If the curved conductive ribbon springs 32 are wide enough, they can tolerate considerable relative tip movement in almost all directions and still make electrical contact. The curved conductive ribbon springs 32 could also have varying widths. These particular geometries, e.g. two semicircles slipping past each other, may minimize the overall loop area through all spans, because the effective ground contact slides closer to the probe tips 20 as the span is reduced.

These springs can be epoxied or soldered to the bulk ground on the rest of the probe body, which may be a PCB or a coaxial connector 28. The diameter, width, and material thickness can all be varied to fit desired initial and final span ranges. Furthermore, the curved shape of the springs does not need to be circular, e.g. it could be shaped to control the sliding differently, or to have more or less flexibility in certain span ranges.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A handheld contact probe comprising:
    first and second opposing probe tip assemblies each comprising a probe tip circuit coupled to a probe tip at a distal end thereof;
    a probe tip span adjustment mechanism configured to adjust a span between the probe tips; and
    a ground path mechanism coupled between the probe tip circuits of the respective first and second probe tip assemblies, and comprising at least one curved conductive ribbon spring configured to elastically deform and slidably maintain electrical coupling between the probe tip circuits of the first and second opposing probe tip assemblies while the span between the probe tips is adjusted by the probe tip span adjustment mechanism, wherein the at least one curved conductive ribbon spring comprises a W-shaped conductive ribbon spring configured to elastically deform and, at outer ends thereof, slidably maintain electrical contact at the probe tip circuits of the first and second opposing probe tip assemblies while the span between the probe tips is adjusted by the probe tip span adjustment mechanism.

2. The handheld contact probe of claim 1, wherein the probe tip circuit of each of the first and second probe tip assemblies comprises a printed circuit board.

3. The handheld contact probe of claim 1, wherein the probe tip of each of the first and second probe tip assemblies comprises a pogo pin.

4. The handheld contact probe of claim 1, wherein the first and second opposing probe tip assemblies are symmetrical.

5. The handheld contact probe of claim 1, wherein the W-shaped conductive ribbon spring comprises a copper alloy spring metal and gold plating.

6. The handheld contact probe of claim 1, wherein the W-shaped conductive ribbon spring comprises a metal including at least one of beryllium copper (BeCu), phosphor bronze and spring steel.

7. The handheld contact probe of claim 1, further comprising a pair of signal connectors carried by a housing and coupled to respective probe tip circuits via corresponding transmission lines.

8. A handheld contact probe comprising:
    first and second opposing probe tip assemblies each comprising a probe tip circuit coupled to a probe tip at a distal end thereof;
    a probe tip span adjustment mechanism configured to adjust a span between the probe tips; and a ground path mechanism coupled between the probe tip circuits of the respective first and second probe tip assemblies, and comprising at least one curved conductive ribbon spring configured to elastically deform and slidably maintain electrical coupling between the probe tip circuits of the first and second opposing probe tip assemblies while the span between the probe tips is adjusted by the probe tip span adjustment mechanism, wherein at least one curved conductive ribbon spring comprises a U-shaped conductive ribbon spring configured to elastically deform and, at a first end thereof, is coupled to a probe tip circuit of the first probe tip assembly, and at a second end thereof, slidably maintains electrical contact at the probe tip circuit of the second probe tip assembly while the span between the probe tips is adjusted by the probe tip span adjustment mechanism.

9. The handheld contact probe of claim 8, wherein the probe tip circuit of each of the first and second probe tip assemblies comprises a printed circuit board.

10. The handheld contact probe of claim 8, wherein the probe tip of each of the first and second probe tip assemblies comprises a pogo pin.

11. The handheld contact probe of claim 8, wherein the first and second opposing probe tip assemblies are symmetrical.

12. The handheld contact probe of claim 8, wherein the U-shaped conductive ribbon spring comprises a copper alloy spring metal and gold plating.

13. The handheld contact probe of claim 8, wherein the U-shaped conductive ribbon spring comprises a metal including at least one of beryllium copper (BeCu), phosphor bronze and spring steel.

14. The handheld contact probe of claim 8, further comprising a pair of signal connectors carried by a housing and coupled to respective probe tip circuits via corresponding transmission lines.

* * * * *